US007664196B2

(12) United States Patent
Adlerstein

(10) Patent No.: US 7,664,196 B2
(45) Date of Patent: Feb. 16, 2010

(54) FREQUENCY AGILE PHASE LOCKED LOOP

(75) Inventor: Michael G Adlerstein, Wellesley, MA (US)

(73) Assignee: Raytheon Company, Waltham, MA (US)

(*) Notice: Subject to any disclaimer, the term of this patent is extended or adjusted under 35 U.S.C. 154(b) by 604 days.

(21) Appl. No.: 11/557,633

(22) Filed: Nov. 8, 2006

(65) Prior Publication Data

US 2008/0106339 A1    May 8, 2008

(51) Int. Cl.
*H04B 7/02* (2006.01)
(52) U.S. Cl. .......................... 375/267; 375/376
(58) Field of Classification Search ................. 375/267, 375/371, 373, 376
See application file for complete search history.

(56) References Cited

U.S. PATENT DOCUMENTS 3,251,062 A * 5/1966 Ghose ..................... 342/371
6,982,670 B2 1/2006 Mohamadi 2001/0036240 A1 11/2001 Gossmann et al.

FOREIGN PATENT DOCUMENTS

DE    EP 1 624 574 A1    8/2006
JP    EP 0 847 142 A1    10/1998

OTHER PUBLICATIONS

Notification of transmittal of the International Search Report and the Written Opinion of the International Searching Authority, or the Declaration dated Apr. 24, 2008, Application No. PCT/US2007/022213.
Notification Concerning Transmittal of International Preliminary Report on Patentability (Chapter 1 of the Patent Cooperation Treaty), PCT/US2007/022213 dated May 22, 2009 and the Written Opinion of the International Searching Authority, 8 pages.

* cited by examiner

*Primary Examiner*—David B Lugo
(74) *Attorney, Agent, or Firm*—Daly, Crowley, Mofford & Durkee, LLP

(57) ABSTRACT

A circuit having a frequency controllable oscillator and a variable time delay circuit. The time delay circuit is fed by a signal produced by the oscillator, such time delay circuit being coupled to the oscillator to control the frequency of the signal produced by the oscillator. The circuit allows frequency agility of a phase locked loop although locked to a common reference frequency.

7 Claims, 5 Drawing Sheets

FREQUENCY AGILE PHASE LOCKED LOOP

TECHNICAL FIELD

This invention relates generally to electronic Phase Locked Loops (PLL) and more particularly PLLs locked to a common reference signal.

BACKGROUND

As is known in the art, electronic phase locked loops have a wide range of applications. One such application is in phased array systems. More particularly, transmit/receive elements in phased array antennas require stable phase and frequency reference provided to all the array elements in order to steer the beam in the desired direction. Several methods are known in the art for providing such a reference and accomplishing the required phase shift in each element. In multifunction systems, several such references must be provided simultaneously or alternatively upon demand, to various portions of the system. It is desirable to have a commonality of parts at the elements. It is also desirable to utilize a single system-wide frequency reference in lieu multiple interfering frequencies.

Frequency and phase reference may be provided to array elements in several ways. A first method provides an RF frequency reference and introduces a phase shift into the signal path. For transmit and receive this phase shift might be accomplished by switching high-pass and low-pass filters in and out of the RF signal path. The phase shifting may be accomplished in a "common-leg" circuit shared by the transmit and the receive paths.

Alternatively, referring to the receive case, one may use a mixer to down convert the RF signal within the element. This allows a system-to-element interface to be at a lower Intermediate Frequency (IF). The phase shifters may be placed in the LO path and therefore do not contribute to RF losses. Therefore several stages of RF gain may be omitted from the T/R element. An important application of the frequency conversion approach is when the Local Oscillator (LO) is produced on each array element such that the system interface can be at low frequency.

More particularly, the low frequency reference signal is used to synchronize the Local Oscillator by using a digital prescaler (divide by N) circuit as shown in FIG. 1. A portion of the tunable oscillator signal is divided by binary circuits until the frequency is equal to that of the injected reference signal. The phase of the reference signal is compared with the output of the prescaler. The oscillator is adjusted to make the phase difference zero. The phase shifter is shown, as know in the art, to be in the local oscillator (LO) path. The approach described above is not well suited to multifunction system or systems where the frequency at each element or group of elements must be varied independently. In the usual approach, a single reference frequency provided to all the elements precludes frequency agility since all the elements must remain locked to a particular multiple of this frequency reference.

SUMMARY

In accordance with the present invention, a circuit is provided comprising: a frequency controllable oscillator; and a time delay circuit, such time delay circuit being fed by a signal produced by the oscillator, such time delay circuit being coupled to the oscillator to control the frequency of the signal produced by the oscillator.

In one embodiment, an oscillator is provided comprising: a phase detector; a low pass filter coupled to an output of the phase detector; a voltage controlled oscillator fed by the low pass filter; and a variable time delay circuit fed by a portion of an output of the voltage controlled oscillator. The phase detector is fed by the variable time delay circuit and a reference signal.

In one embodiment, the oscillator includes frequency dividers in circuit between the output of the voltage controlled oscillator and the variable time delay circuit.

In one embodiment, a system is provided having a plurality of elements each one of the elements being coupled to a corresponding one of a plurality of oscillator sections, each one of the oscillator sections being connected to a common port. Each one of the oscillator sections comprises a phase detector; a low pass filter coupled to an output of the phase detector; a voltage controlled oscillator fed by the low pass filter; and a variable time delay circuit fed by a portion of an output of the voltage controlled oscillator. The phase detector is fed by the variable time delay circuit and a reference signal. A mixer section is coupled to the voltage controlled oscillator, the element and the common port.

In one embodiment, the plurality of oscillator sections produce, in response to a selectable time delay provided by the time delay circuit of each one of the phase shifters of each one of the phase shifter sections, a relative frequency shift between the elements related to the said selectable time delay at each one of the elements.

In one embodiment, each one of the oscillators comprises: a phase detector; a low pass filter coupled to an output of the phase detector; a variable controlled oscillator fed by the low pass filter; and a feedback loop fed by a portion of an output of the voltage controlled oscillator, comprising, in series, a frequency divider and a variable time delay. The phase detector is fed by the feedback loop, the output of the phase detector being related to a phase difference between a signal produced by the second frequency divider and a reference frequency signal.

With such an arrangement, as noted, a time delay is provided at each element such that the apparent period of the prescaled LO frequency as fed to the frequency-phase detector differs from that at the LO itself. The action of the phased locked loop will be to produce a desired frequency change at the LO to compensate for the apparent period at the phase detector.

In one embodiment, the variable time delay comprises an integrator having a varactor.

In another embodiment, the variable time delay comprises switch transmission lines or reactive circuit elements.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
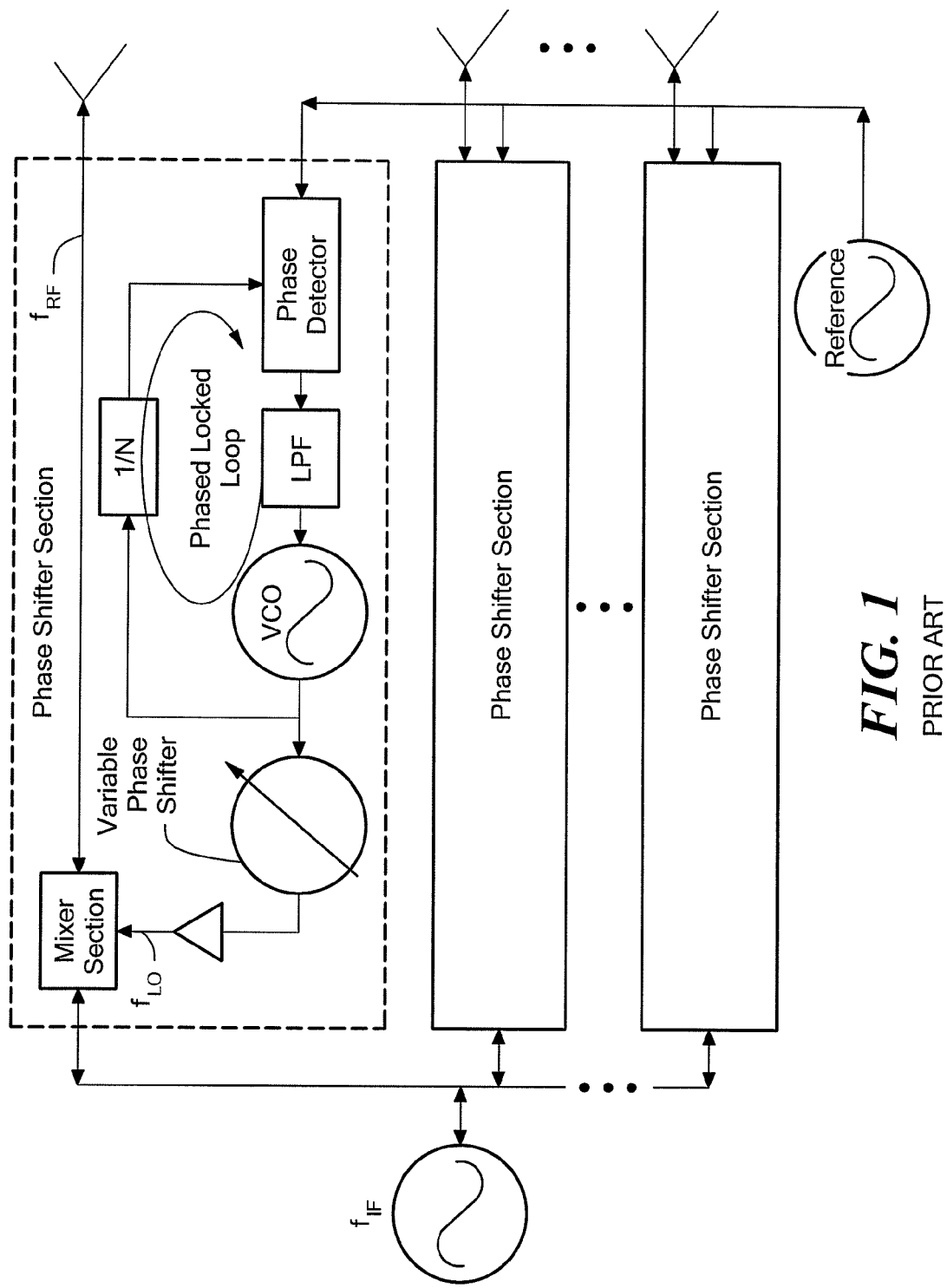
FIG. 1 is a phased array system according to the PRIOR ART.
Figure 2:
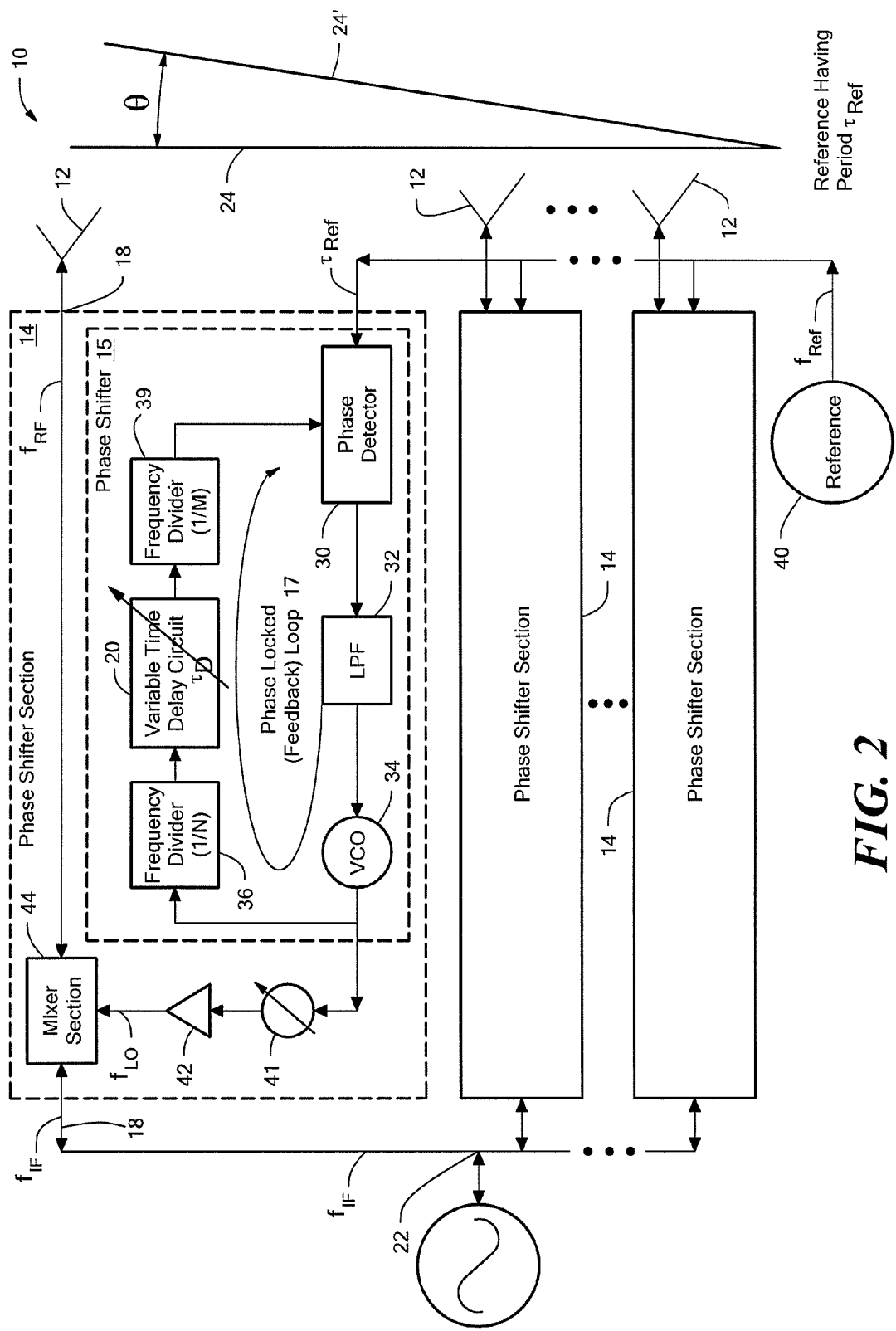
FIG. 2 is a phased array system according to the invention.

Referring now to FIG. 2, a phased array system 10 is shown having a plurality of elements, with antenna or radiating elements, 12, each one of the elements being coupled to a corresponding one of a plurality of phase shifter sections 14. Each one of the phase shifter sections 14 includes: an array port 16 coupled to the corresponding one of the elements 12; a beam port, here an intermediate frequency (IF) port 18 which provides a frequency and phase reference to the element 12; and a variable time delay circuit 20 for providing a selectable time delay to energy passing to the array port 16. Each one of the IF ports 18 is coupled to a common port 22 of the phased array system 10. The plurality of phase shifters 14 produce, in response to the selectable phase of each one of the plurality of phase shifters 14, a directed beam of the energy between the common port 22 and the plurality of elements 12. It is understood that the directed beam may be used reciprocally in either the receive or transmit mode of the array.

Thus, if the frequencies phases and amplitudes of each one the plurality of phase shifters 14 are equal, a directed beam has wavefront indicated as 24 is produced, such beam being directed along the boresight axis of the system 10. On the other hand if there is a fixed phase shift in emission between phase shifters, a directed beam is produced having a wavefront indicated as 24', the beam is directed along an axis having an angle θ from the boresight axis. The angle is such that energy radiating from each of the elements 12, although variously delayed, arrives along the wavefront at the same time.

More particularly, each one of the phase shifter sections 14 is identical in construction. An exemplary one thereof is shown in detail to include a phase shifter 15 having a phased locked (feedback) loop 17 having: a phase detector 30; a low pass filter 32 coupled to an output of the phase detector 30; a variable, here a voltage, controlled oscillator (VCO) 34 fed by the low pass filter 32; and a first frequency divider 36, here a divide by N frequency divider, where N is an integer, fed by a portion of an output of the voltage controlled oscillator 34. A second frequency divider 39, here a divide by M frequency divider, where M is an integer, is fed by the variable time delay circuit 20. The first frequency divider 36 and second frequency divider 39 provide a prescaler. The phase detector 30 is fed by the second frequency divider 39, the output of the phase detector 30 being related to a phase difference between a signal produced by the second frequency divider 39 and a reference frequency signal from reference source 40. Each one of the plurality of phase shifters is fed the reference frequency signal. In some phased array systems, different frequencies might be required for various sections of the array at various times. The invention allows this frequency agility even though a common reference frequency is provided to the entire array.

Another portion of the output of the VCO 34 is fed through a variable phase shifter 41 and an amplifier 42 to a mixer section 44, as shown. The mixer section 44 is coupled to the common port 22 and the element 12. The output of the amplifier 42 is a local oscillation signal having the frequency $f_{LO}$. The signal at the array port 16 and at the element 12 is radio frequency, $f_{RF}$.

Basic to the invention is the inclusion of time delay circuitry 20 in between the frequency dividers 36, 39 of the prescaler. Consider the output of each divide by two prescaler stages. Since the prescaler circuitry is digital, the output of the oscillator 34 may be considered to be a series of pulses on voltage peaks. The input pulses are spaced by $\tau_{LO}=1/f_{LO}$. The output of the first divider is a pulse at every other IF pulse. This continuing separation in time between the peaks continues stage by stage until the time spacing between the peaks is near to the period of the injected reference signal. For example, suppose $f_{LO}=8$ GHz and the injected reference signal is 125 MHz. Then N=64 which implies six stages of dividers ($2^6=64$).

Through the action of the phase detector and low pass filter, the frequency of the oscillator 34 will be held at the point where the pulses at the output of the last divider coincide with the pulses emanating from the system reference oscillator 40 (125 MHz in the example). Now suppose that arbitrary time delays are introduced between the frequency dividers. The system will still produce a frequency and phase lock since each output remains periodic. However, the LO frequency at lock will be modified. A quantitative explanation of the technique is provided by applying the time coincidence enforced at the phase detector. The binary frequency dividers are viewed as period multipliers. Suppose that there are N binary dividers followed by a time delay 1D. This is then followed by another M binary dividers. Thus, in the steady state, the feedback loop 17 forces:

$$2^M(2^N \tau_{VCO}+\tau_D)=\tau_{REF} \quad (1)$$

or;

$$\tau_{VCO}=\tau_{REF}/2^{N+M}-\tau_D/2 \quad (2)$$

If $\tau_D$ is short enough such that $\tau_{VCO}>0$ then the output signal produced by the VCO 34 may be represented as:

$$f'_{VCO}/f_{VCO}=1/[1-(f_{VCO}\tau_D)/2^N] \quad (3).$$

Figure 3:
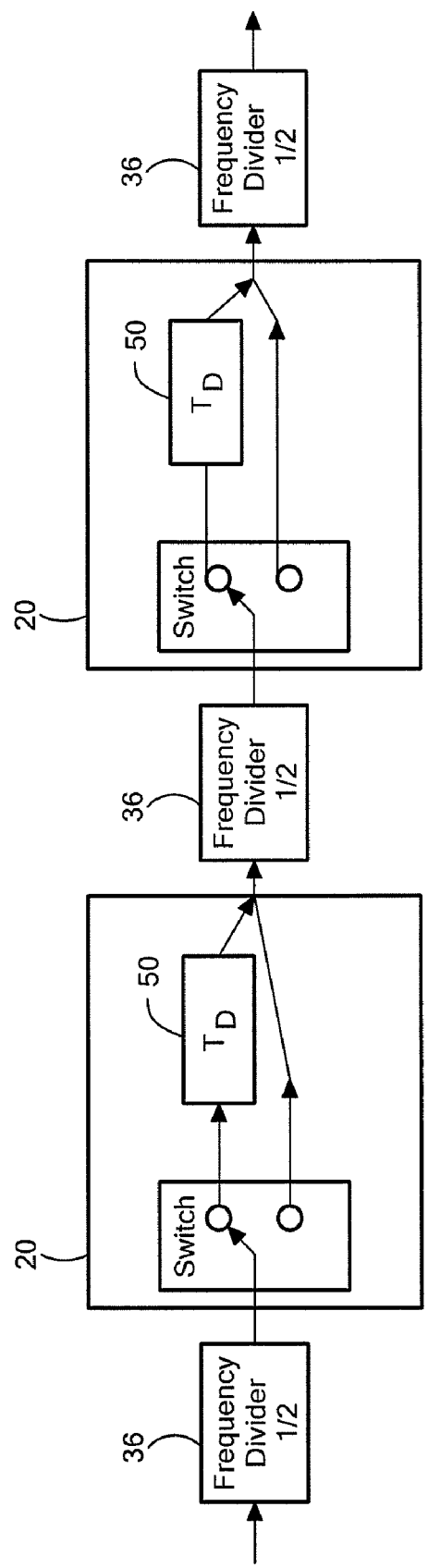
FIG. 3 is a block diagram of a phased locked loop adapted for use in the phased array system of FIG. 2.

The calculation shows the effect a given time delay introduced between various frequency divider stages. One can tabulate the initial and final frequency ratios from equation 3. For example, if $f_{VCO}\tau_D=0.8$ and N=4, then a 5.3% frequency increase can be achieved. For this result, it is necessary for the VCO to be tunable over such a frequency range. Furthermore, the time delays are additive to produce discretely selectable frequency shifts. A further advantage of the technique is that the time delays can be readily integrated with the digital circuitry comprising the frequency dividers as shown in FIG. 3.

Figure 4:
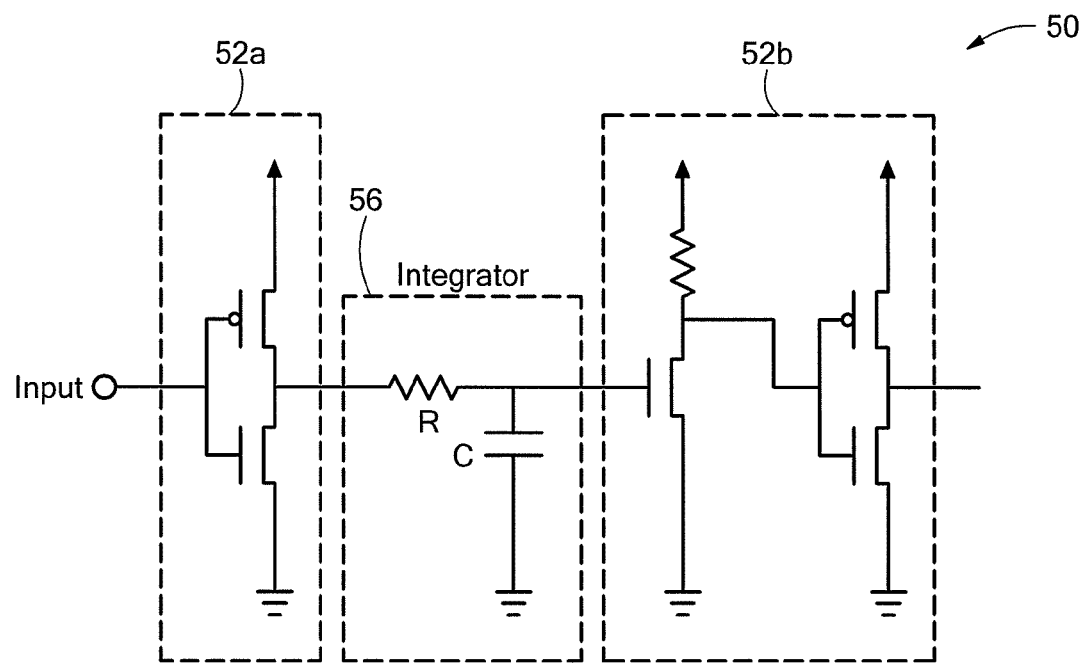
FIG. 4 is a block diagram of a variable time delay circuit adapted for use in the phased array system of FIG. 2.

Referring to FIG. 4, a typical CMOS time delay circuit 50, as is know in the art, see for example, B. R. Jackson and C. E. Saavedra "An L-Band CMOS Frequency Doubler using a Time-Delay Technique", Silicon Monolithic Integrated Circuits in RF Systems, 2006. Digest of Papers 2006, Topical Meeting on 18-20 Jan. 2006 Page(s): 4 pp. Digital Object Identifier 10.1109/SMIC.2005.15825. There is a pull up/down buffer 52a, 52b at the input and output, respectively, of the circuit. The circuit includes an integrator 56 having a resistor R and a fixed capacitance C. The RC circuit (i.e., integrator 56) charges with a time constant which triggers the comparator stage 52b. In practice, the component values would be set such that $\tau_D$ is short enough such that $\tau_{VCO}>0$ as noted in Equation 2. For a 5 bit phase shifter in the six divider example discussed above, there would be several options for placement of the delay circuits characterized by the placement of the first time delay circuit: (1) after the oscillator (2) after the first divider (3) after the second divider. The choice would be dictated by realiaizability issues during detailed design. The desired time delay circuits can be implemented not only with lumped electrical elements but also with distributed elements as desired.

Figure 5:
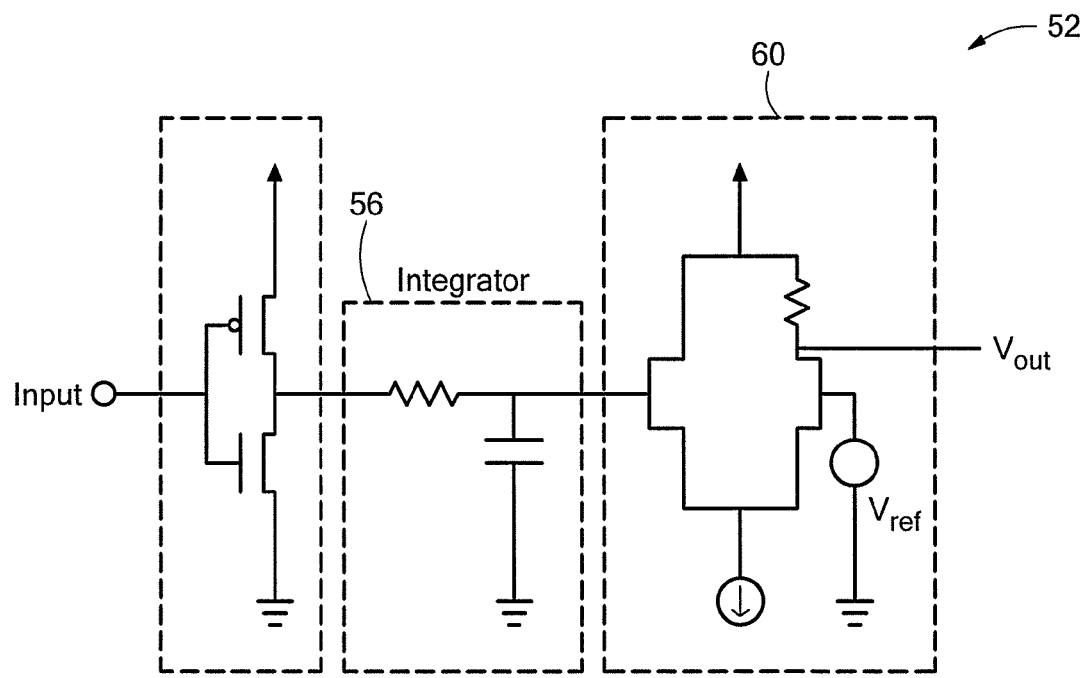
FIG. 5 is a block diagram of another variable time delay adapted for use in the phased array system of FIG. 2.

FIG. 5 shows an alternative implementation of the design such that the time delay 52 can be adjusted and varied continuously. This is accomplished by passing the output of the integrator 56 into a voltage comparator 60. Thus, the choice of a reference voltage determines the trigger point for the time delay. The voltage $V_{ref}$ can be set by a digital to analog converter.

Figure 6:
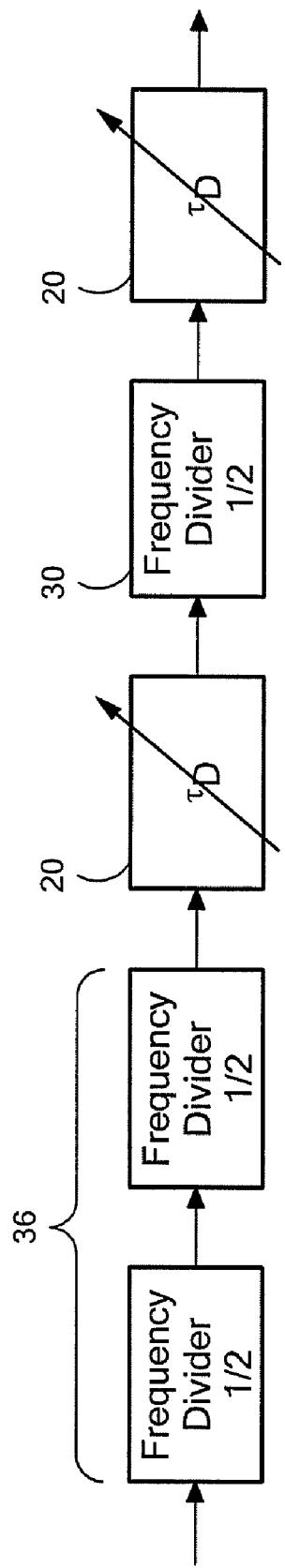
FIG. 6 is a block diagram of still another variable time delay adapted for use in the phased array system of FIG. 2.

FIG. 6 shows an example of how combinations of continuously variable time delays can give a "coarse" and "fine" frequency adjust.

A number of embodiments of the invention have been described. Nevertheless, it will be understood that various modifications may be made without departing from the spirit and scope of the invention. For example, while the PLL according to the invention has been described in the context of a phased array system, the PLL may be used in any one of a variety of applications. Accordingly, other embodiments are within the scope of the following claims.

What is claimed is:

1. A system having a plurality of elements each one of the elements being coupled to a corresponding one of a plurality of oscillator sections, each one of the oscillator sections being connected to a common port, each one of the oscillator sections comprising:

(A) an oscillator, comprising:
      a phase detector;
      a low pass filter coupled to an output of the phase detector;
      a voltage controlled oscillator fed by the low pass filter;
      a variable time delay circuit fed by a portion of an output of the voltage controlled oscillator; and
      wherein the phase detector is fed by the variable time delay circuit and a reference signal; and (B) a mixer section coupled to the voltage controlled oscillator, the one of the elements in such one of the oscillator sections and the common port and (C) wherein the plurality of oscillator sections produce, in response to a time delay provided by the time delay circuit of each one of the oscillator sections, a relative frequency shift between the plurality of antenna elements, such relative frequency shift being related to a selectable time delay provided by the variable time delay at each one of the elements.

2. The system recited in claim 1 wherein each one of the oscillators comprises:
   a feedback loop fed by a portion of an output of the voltage controlled oscillator, comprising, in series, a frequency divider and the variable time delay in such one of the oscillator sections; and
   wherein the phase detector is fed by the feedback loop, the output of the phase detector being related to a phase difference between a signal produced by the frequency divider and the reference frequency signal.

3. The system recited in claim 2 wherein each one of the plurality of oscillators is fed by the reference frequency signal.

4. The system recited in claim 3 wherein the variable time delay comprises a switchable time delay line network.

5. The system recited in claim 4 wherein the switchable time delay line network comprises a plurality of delay lines having different electrical lengths.

6. The system recited in claim 3 wherein the variable time delay comprises an integrator having a varactor.

7. The system recited in claim 1 wherein each one of the oscillators comprises:
   a feedback loop fed by a portion of an output of the voltage controlled oscillator, comprising, in series, a first frequency divider, the variable time delay and a second frequency divider in such one of the oscillator sections; and
   wherein the phase detector is fed by the feedback loop, the output of the phase detector being related to a phase difference between a signal produced by the second frequency divider and the reference frequency signal.

* * * * *

UNITED STATES PATENT AND TRADEMARK OFFICE
CERTIFICATE OF CORRECTION

PATENT NO. : 7,664,196 B2 Page 1 of 1
APPLICATION NO. : 11/557633
DATED : February 16, 2010
INVENTOR(S) : Michael G. Adlerstein It is certified that error appears in the above-identified patent and that said Letters Patent is hereby corrected as shown below:

Column 1, line 23, delete "lieu multiple" and replace with --lieu of multiple--.

Column 1, line 28, delete "transmit and receive this" and replace with --transmit and receive elements, this--.

Column 1, line 50, delete "know" and replace with --known--.

Column 1, line 52, delete "to multifunction" and replace with --to a multifunction--.

Column 3, line 25, delete "frequencies phases" and replace with --frequencies, phases--.

Column 3, line 27, delete "has wavefront" and replace with --has a wavefront--.

Column 3, line 41, delete "voltage, controlled" and replace with --voltage controlled--.

Column 3, line 63, delete "oscillation" and replace with --oscillator--.

Column 4, line 24, delete "dividers" and replace with --divider--.

Column 4, line 25, delete "dividers" and replace with --divider--.

Column 4, line 32, delete "-$\tau_D/2$"and replace with -- -$\tau_D/2^N$--.

Column 4, line 38, delete "effect a" and replace with --effect of a--.

Column 4, line 50, delete "know" and replace with --known--.

Column 5, line 9, delete "digital to analog" and replace with --digital-to-analog--.

Column 5, line 39, delete "port and" and replace with --port; and--.

Signed and Sealed this

Twentieth Day of July, 2010

David J. Kappos
*Director of the United States Patent and Trademark Office*